United States Patent [19]

Praria

[11] Patent Number: 4,505,032
[45] Date of Patent: Mar. 19, 1985

[54] METHOD OF MAKING A VOLTAGE DIVIDER

[75] Inventor: Guy B. Praria, Wayland, Mass.

[73] Assignee: Analogic Corporation, Wakefield, Mass.

[21] Appl. No.: 626,531

[22] Filed: Jun. 29, 1984

Related U.S. Application Data

[62] Division of Ser. No. 507,744, Jun. 27, 1983, Pat. No. 4,475,099.

[51] Int. Cl.³ .......................................... H01C 17/28
[52] U.S. Cl. ....................................... 29/621; 29/414; 174/126 CS; 219/541; 338/195; 338/49; 338/295; 338/324; 338/325; 338/330; 338/333; 338/328
[58] Field of Search ................ 219/121 EM, 121 LM, 219/541, 543, 552; 338/49, 195, 295, 320, 323, 324, 325, 328, 330, 333, 323; 29/610 R, 611, 620, 621, 414, 415; 174/126 CS

[56] References Cited

U.S. PATENT DOCUMENTS

| | | | |
|---|---|---|---|
| 1,093,968 | 4/1914 | Bicknell | 219/543 X |
| 3,252,091 | 5/1966 | Morgan | 338/49 X |
| 3,668,600 | 6/1972 | Schuberth et al. | 338/320 |
| 3,680,013 | 7/1972 | Pye | 338/325 X |
| 4,041,440 | 3/1977 | Davis et al. | 338/195 |
| 4,097,988 | 7/1978 | Hauschied | 29/620 |
| 4,176,445 | 12/1979 | Solow | 29/621 X |
| 4,196,411 | 4/1980 | Kaufman | 338/314 |
| 4,201,970 | 5/1980 | Onyshkevych | 338/195 |
| 4,215,333 | 7/1980 | Huang | 338/324 X |
| 4,219,797 | 8/1980 | Huang | 338/325 X |
| 4,272,739 | 6/1981 | Nesses | 338/325 X |
| 4,331,949 | 5/1982 | Kagawa | 338/320 X |
| 4,429,298 | 1/1984 | Oberholzer | 338/195 |
| 4,434,416 | 2/1984 | Schonberger | 29/414 X |

FOREIGN PATENT DOCUMENTS

| | | | |
|---|---|---|---|
| 2611819 | 9/1977 | Fed. Rep. of Germany | 338/195 |
| 46-26007 | 7/1971 | Japan | 338/320 |

OTHER PUBLICATIONS

R. L. Brown, IBM, Technical Disclosure Bulletin, vol. 22, No. 3, p. 956, Aug. 1979, "Cermet Resistor Trimming".

Primary Examiner—Volodymyr Y. Mayewsky
Attorney, Agent, or Firm—Joseph S. Iandiorio

[57] ABSTRACT

An apparatus relating to a voltage divider having one or more Kelvin connection taps, including first and second spaced terminals and a current carrying resistor between the first and second terminals. A third terminal is spaced from the resistor and the resistor has at least one conductive but non-current-carrying peninsula extending from a junction on the side of the resistor and connecting with the third terminal to produce a Kelvin connection tap. A cut is made only in the non-current-carrying peninsula along the path having a component parallel to the side of the resistor from which the peninsula extends and shading the junction of said peninsula and the side from the third terminal, to adjust the interconnection of the third terminal with the resistor and vary the voltage output without varying the resistance of the resistor. An extension of this cut may be made parallel to the edge of the peninsula to further increase the adjustment.

1 Claim, 9 Drawing Figures

METHOD OF MAKING A VOLTAGE DIVIDER

This application is a division of application Ser. No. 507,744, filed June 27, 1983, now U.S. Pat. No. 4,475,099.

FIELD OF INVENTION

The invention relates to a voltage divider having one or more Kelvin connector taps, and more particularly to such a voltage divider in which the tap or taps are formed of a non-current-carrying peninsula extending from a current-carrying resistor.

BACKGROUND OF INVENTION

Single and multiple tap voltage dividers, thick film, thin film and monolithic, are widely used in electronic equipment. In many cases these divider taps constitute Kelvin connections, i.e. connections in which no or essentially no current flows. Such dividers are used in many applications including operational amplifiers circuits and digital to analog converters. There are a number of problems associated with such dividers. For example, in thick film technology a voltage divider is made by interconnecting two or more thick film resistors. All of the resistors must therefore be as nearly identical as possible, e.g. use the same paste, same type of terminals and same fabrication techniques simultaneously applied. Even then, one or more of the resistors will have to be trimmed in order to accurately establish the correct voltage proportions at the taps. For a single tap, at least one but usually both resistors are trimmed. For two taps, at least two resistors are trimmed, and so on. Trimming requires a first cut to bring the resistor within about one percent of the desired value, then heating the resistor to soften a glass coating to relieve trim-induced stress, followed by a second, smaller trim in the shadow of the first. Trimming affects temperature stability to some extent, but affects long-term stability to an even greater extent. The approach of using a number of different resistors requires close matching of the resistors to obtain similar temperature coefficients and long-term stability or drift characteristics among the resistors of a voltage divider.

SUMMARY OF INVENTION

It is therefore an object of this invention to provide an improved voltage divider having one or more Kelvin connection taps.

It is a further object of this invention to provide such a voltage divider which reduces tracking error over the full operating temperature range.

It is a further object of this invention to provide such a voltage divider which reduces instability or drift due to aging and temperature.

It is a further object of this invention to provide such a voltage divider which simplifies resistor fabrication and reduces fabrication time and cost.

It is a further object of this invention to provide such a voltage divider which can be trimmed precisely to the limits of the measuring equipment.

It is a further object of this invention to provide such a voltage divider which enables a number of different ratios or taps to be independently trimmed on a single resistor.

It is a further object of this invention to produce such a voltage divider which does not require special or matched terminals or resistor material.

It is a further object of this invention to provide such a voltage divider which does not rely on the absolute value of the resistance.

The invention results from the realization that in a Kelvin connection tap laterally extending from a resistor, a transverse cut or trim will adjust the effective location of the interconnection of the tap with the resistor without affecting the resistance or stability of the resistor.

The invention features a voltage divider having one or more Kelvin connection taps. There are first and second spaced terminals and a current-carrying resistor between those terminals. A third terminal is spaced from the resistor. The resistor has at least one conductive, non-current-carrying peninsula extending from a junction on a side of the resistor and connecting with the third terminal to produce a Kelvin connection tap. A cut is made only in the non-current-carrying peninsula along the path having a component parallel to the side of the resistor from which the peninsula extends and shading the junction of the peninsula and the side from the third terminal to adjust the interconnection of the third terminal with the resistor and vary the voltage output without varying the resistance of the resistor. An extension of this cut may be made parallel to the edge of the peninsula to further increase the adjustment. The peninsula may contain one or more holes to increase the effectivness of the adjustment.

The invention also features a method of making such a voltage divider having one or more Kelvin connection taps, including first and second spaced terminals and forming a current-carrying resistor between the first and second terminals. The method also includes constructing a third terminal spaced from the resistor and forming at least one non-current-carrying peninsula of the resistor extending from a junction on a side of the resistor and connecting it with the third terminal to produce a Kelvin connection tap. The setting of the voltage divider is trimmed by cutting into only the non-current-carrying peninsula along a path having a component parallel to the side of the resistor from which the peninsula extends and shading the junction of the peninsula and the side from the third terminal to adjust the interconnection of the third terminal with the resistor and vary the voltage output without varying the resistance of the resistor. The resistor may include a plurality of such non-current-carrying resistors and associated third terminals. The peninsulas may all extend from one side of the resistor, or they may extend from both sides of the resistor. The peninsula may extend at an angle or generally perpendicular to the side of the resistor for its entire length, or only for its initial portion, after which it extends generally parallel or at some other transverse angle to the side of the resistor. The peninsula may take any desirable form, including triangular, wherein the base of the triangle is at the side of the resistor and the edges of the triangle converge toward the third terminal. The peninsula may contain one or more holes to increase the effectiveness of the adjustment.

DISCLOSURE OF PREFERRED EMBODIMENT

Other objects, features and advantages will occur from the following description of a preferred embodiment and the accompanying drawings, in which.

Figure 1:
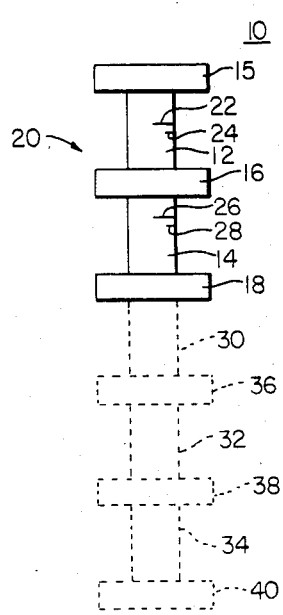
FIG. 1 is a view of a prior art voltage divider.

There is shown in FIG. 1 a typical prior art voltage divider 10 which is formed of two resistors, 12, 14, interstitially arranged between terminals 15, 16 and 18. Terminal 16 acts as a voltage divider tap. Although it is shown generally centrally located in FIG. 1, it may be located anywhere between terminals 15 and 18. Because the primary current-carrying resistor 20 of voltage divider 10 is actually formed of two separate resistors 12 and 14, great care must be exercised in the making and trimming of these resistors. The material, the size and the shape of resistors 12 and 14 must be carefully controlled. They must be formed and fabricated of at least similar materials and at the same time in order to minimize temperature coefficient and long-term instability differences. Because they are two different resistors, any change in the resistance of one of them due to temperature changes or aging must be matched by a change at the same rate and in the same direction in the other resistor in order that the voltage at tap 16 remain unchanged. Even after careful fabrication, resistors 12 and 14 are usually not exactly the desired resistance value, and so at least one, and usually both of them, will have to be trimmed. This is done by making a transverse cut 22 to gradually increase the resistance of resistor 12 toward the ultimate correct value. The first cut 22 will normally bring the value to within one percent of the desired value. A second cut 24 is then made, typically in the shadow of the first, which trims the value more gradually toward the desired value. When one resistor is trimmed it often becomes necessary to trim the other resistor, and so similar cuts 26 and 28 may be required for resistor 14. This trimming, or cutting, introduces its own instabilities due to the exposure of the resistor material and the heating which is required to soften the glass coating to remove the stresses induced by the cutting. The control of the instabilities, the matching of the resistors and the tailoring or trimming of the resistance values of the resistors become more complex when additional resistors 30, 32 and 34, and associated terminals 36, 38 and 40, are added to provide additional taps.

This invention permits the absolute value of the resistance to be ignored in adjusting for a particular voltage ratio or output. The trims, or cuts, are not made into the main body of the resistor; thus trimming does not affect the resistance of the resistor and there is no requirement to repeatedly trim or heat the resistor. The resistor consists of essentially only one resistor and so matching is automatic. The voltage divider according to this invention is thus much more stable and much more accurately trimmable than prior art resistors, whether thick film, thin film, monolithic, bulk film or wirewound.

By way of comparison, normal carbon composition resistors are generally not trimmable. They have a temperature coefficient of 1,000 to 2,000 ppm/°C., a long-term stability of 20,000 ppm/year, and tracking of 500-1,000 ppm/°C. Conventional thick film resistors are trimmable to within about 0.1%. They have a temperature coefficient of 50-100 ppm/°C., a long-term stability after trimming of 500-1,000 ppm variation per year; and a tracking of 5-50 ppm/°C. Thin film resistors are also trimmable to 0.1%. They have a temperature coefficient of 20-60 ppm/°C., a long-term stability after trimming of 200-400 ppm variation per year, and tracking of 2-6 ppm/°C. In contrast, resistor ratios made according to this invention are trimmable to more than 0.001% accuracy and appear to be limited only by the readout capability of the measuring equipment. The long-term ratio drift is less than 0.1 ppm/1 K.hr., and tracking is better than 1 ppm/°C.

Figure 2:
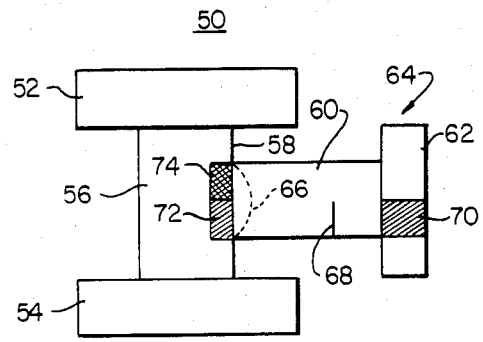
FIG. 2 is a view of a voltage divider having a Kelvin connection tap according to this invention.

There is shown in FIG. 2 a voltage divider 50 according to this invention having first and second terminals 52, 54 with a primary current-carrying resistor 56 between them. Extending laterally out from the side 58 of resistor 56 is a peninsula 60 made of the same material as resistor 56. Peninsula 60 interconnects with terminal 62 to form the Kelvin connection tap 64. By Kelvin connection is meant one in which no, or essentially no, current flows. The current flow is generally longitudinally through resistor 56 from terminal 52 to 54, or from terminal 54 to 52, and although there is a slight bulging 66 of the current flow path there is virtually no current flow through peninsula 60 to terminal 62. The voltage output from tap 64 is simply and stably adjusted by making a cut 68 which has a component parallel to the side 58 from which peninsula 60 extends. Cut 68, as shown, interrupts the path between the lower portion 70, shown shaded, of terminal 62, and the corresponding area 72 of resistor 56. This causes the path to be established between terminal 62 and the portion 74 of resistor 56. Thus the connection of tap 64 has been moved upwardly on resistor 56 due to cut 68. If cut 68 is made somewhat longer the tap will be moved up farther. If cut 68 were made shorter the tap would be lower. The cut may also be made from the top of the peninsula down and may not only extend almost to the opposite side of the peninsula, but may also then turn toward the body of the resistor and run parallel to the edge of the peninsula, almost all the way to the body of the resistor. In this way the voltage may be shifted over a wide range without affecting the resistance of resistor 56. This is so because peninsula 60, although made of the same material as resistor 56, has no current flow in it and thus does not introduce resistance variation or stability problems in response to cut 68.

Figure 3:
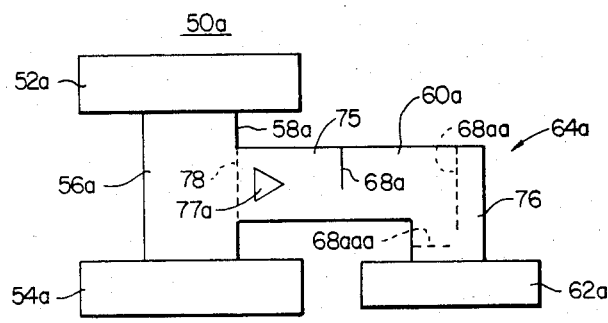
FIG. 3 is a view of a voltage divider similar to FIG. 1 with an alternate arrangement of the Kelvin connection tap and showing a triangular hole to increase effectiveness of a trim cut.

The particular shape and arrangement of the peninsula may be varied, as shown in FIG. 3, where divider 50a has a peninsula 60a with a first portion 75 that extends transversely to the sides 58a and a second portion 76 which is at right angles to portion 75 and generally parallel to resistor 56a. However, the cut or trim 68a must always be made so that it shades the junction 78 where the peninsula 60a meets the side 58a of resistor 56a. For this purpose, the cut 68a is made along a path having a component parallel to the side 58a of the resistor 56 from which peninsula 60a extends. For example, if the cut were made at 68aa it would have no effect of shifting the voltage divider tap, for cut 68aa alone leaves the entire junction area 78 unobscured or unblocked from terminal 62a. Likewise, the cut 68aaa would not perform the necessary shading because terminal 62a could still "see" the entire length of junction 78.

Figure 4:
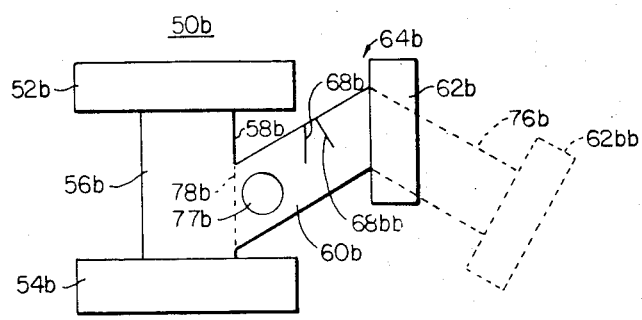
FIG. 4 is a view similar to FIG. 2 with another alternative construction of the Kelvin connection tap and showing a round hole to increase effectiveness of a trim cut.
Figure 5:
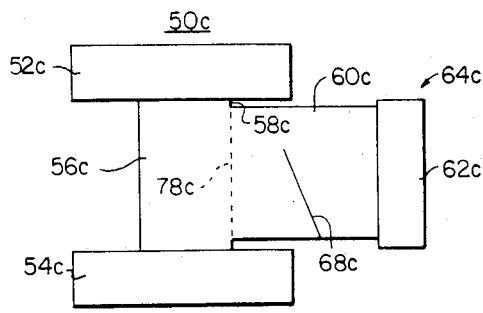
FIG. 5 is a view similar to FIG. 1 with still another construction of the Kelvin connection tap.

Although thus far peninsulas 60 and 60a have been shown extending perpendicularly to sides 58 and 58a, this is not a necessary limitation of the invention. For example, as shown in FIG. 4, peninsula 60b may extend at an angle. The cut 68b is parallel to side 58b and junction 78b, but it need not be; the cut may be made at an angle, such as indicated at 68bb, so long as it has a component which is parallel to side 58b and junction 78b. Peninsula 60b may be extended with a second portion 76b, as shown, or in any other similar fashion. The cuts or trims 68 must be made so as to shade the junction of the peninsula from the third terminal 62bb. A hole such as triangular hole 77a, FIG. 3, or circular hole 77b, FIG. 4, may be used to increase the effectiveness of the trim cut. In FIGS. 2, 3 and 4, the peninsula is approximately equal in width to one third the length of the resistor. In those cases, the trim cut in peninsula 60 produces up to approximately a 25% adjustment of the tap voltage. However, with a wider peninsula 60c, FIG. 5, the voltage tap may be varied up to 100%, or close to it; a narrowed peninsula or longer resistor would allow a finer adjustment.

Figure 6:
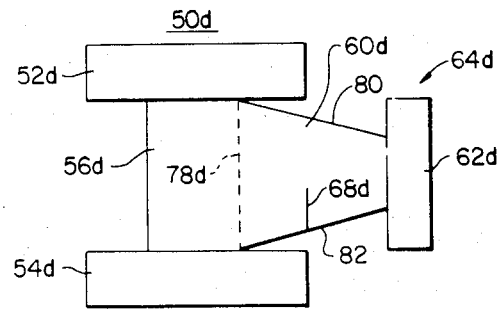
FIG. 6 is a view similar to FIG. 2 with yet another construction of the Kelvin connection tap.

Although the peninsulas in FIGS. 2–5 have generally straight parallel sides, that is not a necessary limitation of the invention, as various shapes may be used without departing from the scope of the invention. For example, as shown in FIG. 6, peninsula 60d may be triangular in shape with its edges 80, 82 converging toward terminal 62d and its base aligned generally coincident with junction 78d.

Figure 7:
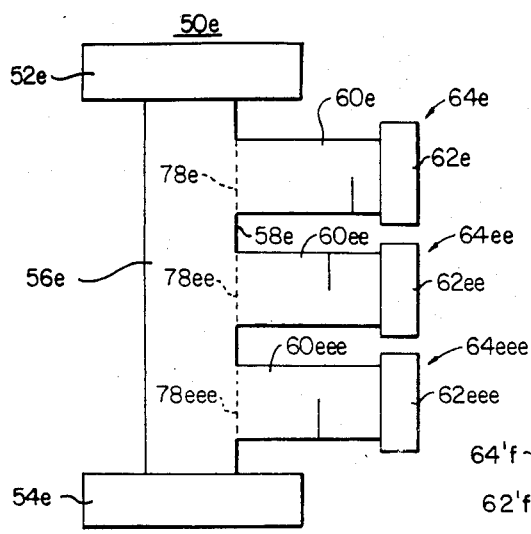
FIG. 7 is a view similar to FIG. 1 showing multiple connection taps on one side of the divider.
Figure 8:
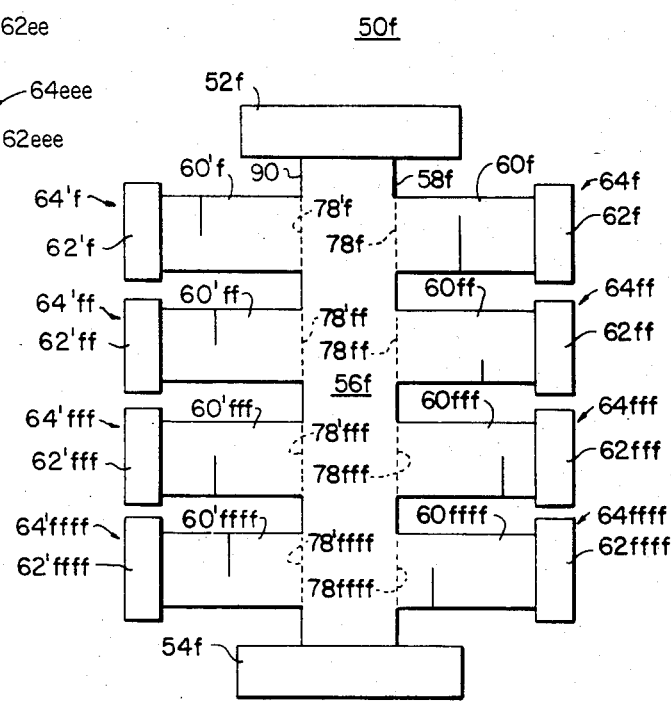
FIG. 8 is a view similar to FIG. 1 showing multiple connection taps on both sides of the voltage divider according to this invention.

The voltage divider according to this invention is not limited to single-tap constructions; it may have any number of desired peninsulas 60e, 60ee, 60eee, FIG. 7, and associated third terminals 62, 62ee, 62eee, and the taps may be arranged on either or both sides as shown in FIG. 8, where there are four Kelvin connection taps 64f, 64ff, 64fff and 64ffff, extending from side 58f, and four additional Kelvin connection taps 64'f, 64'ff, 64'fff and 64'ffff extending from the other side 90.

Figure 9:
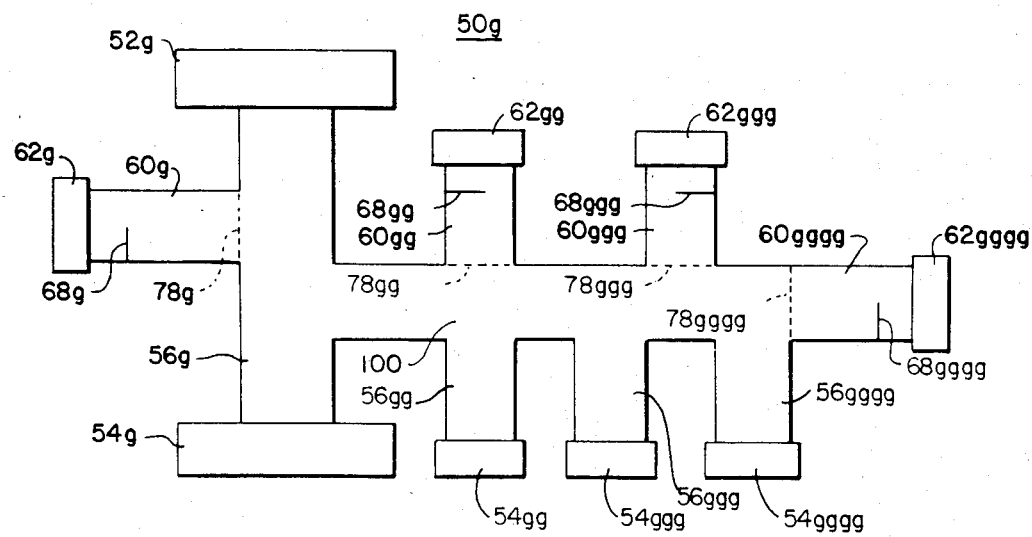
FIG. 9 is a view of a voltage divider according to this invention with more than one current-carrying segment and non-current-carrying peninsulas.

A voltage divider according to this invention 50g, FIG. 9, may also include another current-carrying resistor 100 with both current-carrying, 56gg, 56ggg, 56gggg, and conductive but non-current-carrying, 60gg, 60ggg, 60gggg, peninsulas, in addition to none or one, 60g, or more such peninsulas on current-carrying resistor 56g.

Other embodiments will occur to those skilled in the art and are within the following claims:

What is claimed is:

1. A method of making a voltage divider having at least one Kelvin connection tap comprising:
   constructing first and second spaced terminals;
   forming current-carrying resistor between said first and second terminals;
   constructing a third terminal spaced from said resistor;
   forming at least one conductive non-current-carrying peninsula of said resistor extending from a side of said resistor and connecting with said third terminal to produce a Kelvin connection tap; and
   trimming the setting of the voltage divider by cutting into only said non-current-carrying peninsula along a path having a component parallel to said side of said resistor from which said peninsula extends to adjust the interconnection of said third terminal with said resistor and vary the voltage output without varying the resistance of the resistor.

* * * * *